(12) United States Patent
Feldman

(10) Patent No.: US 7,005,885 B1
(45) Date of Patent: Feb. 28, 2006

(54) METHODS AND APPARATUS FOR INJECTING AN EXTERNAL CLOCK INTO A CIRCUIT

(75) Inventor: Arnold R. Feldman, San Francisco, CA (US)

(73) Assignee: Aeluros, Inc., Mountain View, CA (US)

( * ) Notice: Subject to any disclaimer, the term of this patent is extended or adjusted under 35 U.S.C. 154(b) by 516 days.

(21) Appl. No.: 10/370,833

(22) Filed: Feb. 21, 2003

(51) Int. Cl.
*H03K 19/096* (2006.01)

(52) U.S. Cl. .......................................... 326/16; 326/93

(58) Field of Classification Search ................... 326/16
See application file for complete search history.

(56) References Cited

U.S. PATENT DOCUMENTS 6,741,094 B1 * 5/2004 Ogawa ........................ 326/93
6,765,414 B1 * 7/2004 Keshavarzi et al. .......... 326/93

OTHER PUBLICATIONS

Mehta, S.K.; Seth, S.C.; Einspahr, K.L.; Synthesis for testability by two-clock control; VLSI Design, 1997. Proceedings., Tenth International Conference on; Jan. 4-7, 1997; pp. 279-283.*

* cited by examiner

*Primary Examiner*—R. Stephen Dildine
(74) *Attorney, Agent, or Firm*—Stattler Johansen & Adeli, LLP

(57) ABSTRACT

A synchronous circuit implements a bypass mode for use in conjunction with an inductive-capacitive ("LC") buffer. The LC buffer receives differential conventional clock signals, and generates buffered differential conventional clock signals. A synchronous circuit, such as a latch, includes at least two clock receivers. The conventional clock signal is input to the first clock receiver, such as a transistor, and an auxiliary clock is input to a second clock receiver. The conventional clock signal provides timing for the synchronous circuit under a normal mode of operation, and the auxiliary clock signal provides timing for the synchronous circuit under a test mode of operation at a frequency lower than the conventional clock signal.

29 Claims, 6 Drawing Sheets

METHODS AND APPARATUS FOR INJECTING AN EXTERNAL CLOCK INTO A CIRCUIT

BACKGROUND OF THE INVENTION

1. Field of the Invention

The present invention is directed toward the field of synchronous circuits, and more particularly toward testing of synchronous circuits.

2. Art Background

Data communication systems transport data at a speed defined by a predetermined data rate. The speed of transmitting data in modern broadband communication systems has rapidly increased in recent years. Today, data rates as high as 40 gigabits per second ("Gbps") are required for the OC-768 optical networking standard.

These data communication systems include basic synchronous circuits, such as latches, flip-flops, and constituent logic gates. To operate at high data rates, the synchronous circuits must also switch at high speeds (i.e., the synchronous circuits require a high bandwidth of operation). Thus, the high-speed synchronous circuits require the use of a high-speed clock with low jitter. Another requirement to effectively implement high-speed synchronous circuits is to minimize power dissipation.

To help meet these requirements, it is becoming increasingly more common to use inductive-capacitive ("LC") tuned amplifiers as clock buffers. The LC tuned amplifiers, used to distribute clocks in the high-speed synchronous circuits, drive large capacitive loads on the clock line. These LC tuned amplifiers operate at high impedances within a narrow frequency range (i.e., a narrow clock data rate). For example, a phase lock loop ("PLL") with an LC tuned voltage controlled oscillator may be used to generate the clock and an LC tuned amplifier may be used to buffer the clock.

Synchronous circuits typically include inputs to receive test or bypass clocks. In general, the bypass clocks are input to sections of the synchronous circuits to test the circuits. When debugging timing problems, it is desirable to set the bypass clock over a wide frequency range. In one application, the frequency or clock rate of the bypass clock is relatively low. For high-speed synchronous digital circuits, the frequency or clock rate of the bypass clock may be significantly lower than the clock rate of the device under normal operation. Unfortunately, the use of LC tuned amplifiers in these environments is limited because LC tuned amplifiers have a relatively narrow tuning range. Specifically, the LC tuned amplifiers only amplify over a limited frequency band due to the bandpass response of the tuned load. Thus, traditionally, LC tuned amplifiers preclude testing circuits over a wide frequency range.

To overcome frequency limitations at tuned nodes, an external clock may be injected into the integrated circuit chip through a bypass mode of operation. Typically, the clock is injected through a multiplexor ("MUX") at the output of the PLL. FIG. 1 illustrates a prior art circuit used to implement a conventional clock bypass mode. As shown in FIG. 1, the conventional clock, $f_c$, and a bypass clock, $f_b$, are input to MUX 120. MUX 120 is controlled by a mode selection (i.e., selecting either the conventional clock or the bypass clock). The clock, output from MUX 120, is input to buffer 130. The buffer 130 drives a capacitive load, illustrated by capacitor 140, for input to a plurality of digital circuits (flip-flops 150, 152, 154 and 156).

As explained herein, it is desirable to provide a bypass clock to high-speed synchronous circuits without impeding the operation of the circuits. It is also desirable to provide a bypass clock to high-speed synchronous circuits with an LC clock buffer.

SUMMARY OF THE INVENTION

A synchronous circuit implements a bypass mode for use in conjunction with an inductive-capacitive ("LC") buffer. The LC buffer receives at least one conventional clock signal, and generates one or more buffered conventional clock signals. A synchronous circuit, such as a latch, includes at least two clock inputs: a first clock input that receives the conventional clock signal, and a second clock input signal that receives an auxiliary clock. The conventional clock signal provides timing for the synchronous circuit under a normal mode of operation. The auxiliary clock signal provides timing for the synchronous circuit under a test mode of operation. The auxiliary clock signal has a frequency or clock rate lower than the conventional clock signal. In one embodiment, the auxiliary clock signals and the conventional clock signals are differential signals.

The synchronous circuit comprises clock receiver circuits. In one embodiment, a first clock receiver circuit is coupled to the first clock input, and a second clock receiver circuit is coupled to the second clock input. In one embodiment, the first and second clock receiver circuits comprise transistors. The second clock receiver is coupled in parallel to the first clock receiver circuit, such that the second clock receiver does not affect the operation of the LC buffer and first clock receiver circuit during conventional operation of the circuit. In one embodiment, the LC buffer circuit includes a control circuit that controls the buffering of the conventional clock signal under the normal mode of operation and that disables conventional clock signal under the test mode of operation.

In one embodiment, the clock is buffered in an inductive-capacitive ("LC") buffer. In addition, one or more local buffers are included in the circuit. For this embodiment, the buffered clock from the LC buffer is input to one or more local buffers. A bypass clock line is also an input to the local buffers. The bypass clock input and the clock input are parallel, such that the bypass clock operation does not affect the normal mode of operation. A single clock line output from the local buffer drives at least one clock input on a synchronous circuit.

DETAILED DESCRIPTION

Figure 1:
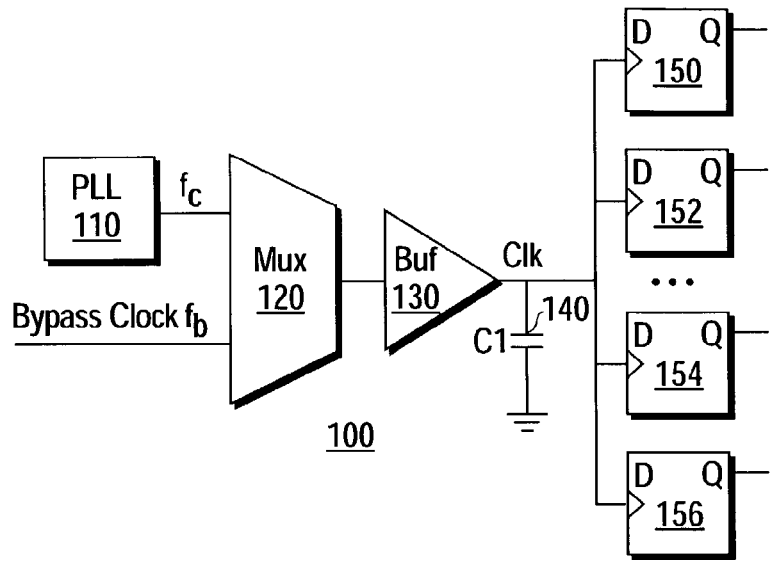
FIG. 1 illustrates a prior art circuit used to implement a conventional clock bypass mode.
Figure 2:
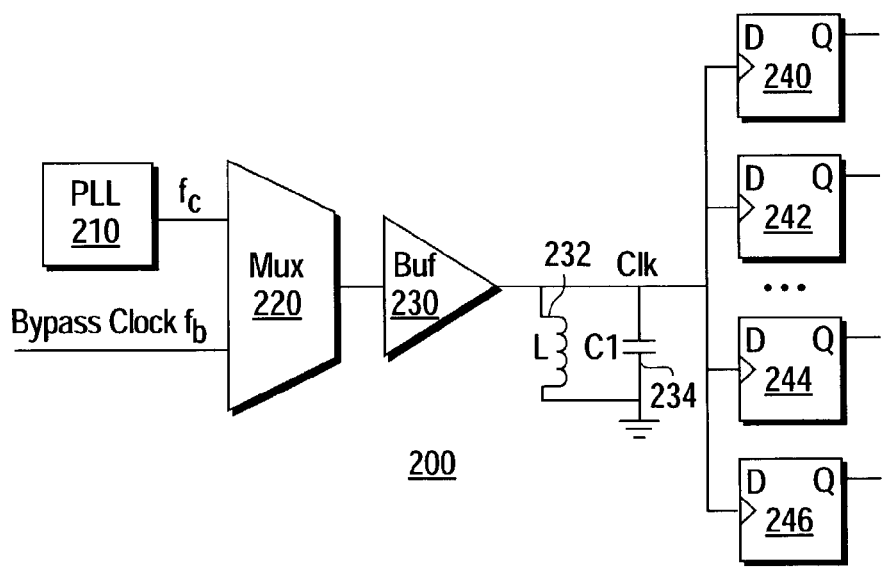
FIG. 2 illustrates a conventional clock bypass mode circuits applied to an LC tuned node.

FIG. 2 illustrates a conventional clock bypass mode circuit applied to an LC tuned node. Circuit 200 of FIG. 2 includes the same elements as circuit 100 of FIG. 1, except buffer 230 in FIG. 2 drives an inductive/capacitive (LC) load, illustrated through the inductor 232 and capacitor 234. The conventional clock bypass circuit, when applied to an LC load, does not operate properly. The inductive load effectively "shorts out" the buffer for frequencies of the bypass clock much lower than the conventional clock. In essence, at lower frequencies, the LC load exhibits a low effective impedance, thereby limiting the clock drive of the buffer. Specifically, the LC buffer provides a large signal of amplitude $A_c$ at the center frequency $$\left(i.e., fc = \frac{1}{2\pi\sqrt{LC1}}\right),$$

and a smaller signal of amplitude, $A_b$, at much lower frequencies (e.g., bypass clock frequencies).

Figure 3A:
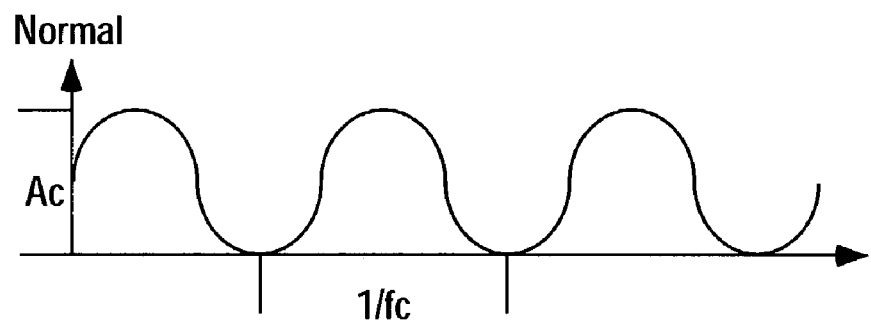
FIG. 3a illustrates a waveform of the output of the buffer during normal high-speed clock operation.
Figure 3B:
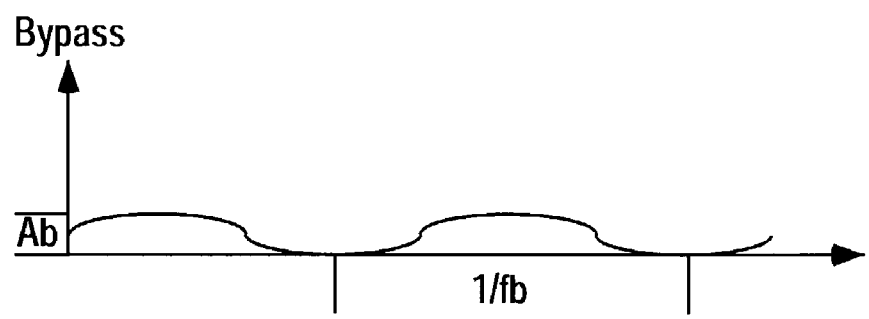
FIG. 3b illustrates a waveform for the output of the buffer at low bypass frequencies.

FIG. 3a illustrates a waveform of the output of the buffer during normal high-speed clock operation. As shown in FIG. 3a, the amplitude of the buffer clock, $A_c$, is sufficient to drive multiple clock inputs. FIG. 3b illustrates a waveform for the output of the buffer at low bypass frequencies (e.g., $f_b$). As shown in FIG. 3b, the amplitude of the clock output from the buffer is low, and thus is insufficient to drive clock inputs in the synchronous circuits.

The technique of the present invention does not inject the bypass clock into an LC tuned buffer. Instead, the bypass clock is injected directly into synchronous circuits. To effectively implement the bypass clock mode, the performance of the synchronous circuits and tuned clock buffer circuits during normal mode of operation must not be impeded. One technique to inject a bypass clock is to add a switch in series with the conventional clock or differential clocks. However, the introduction of the series switch reduces the impedance at the tuned node, and therefore lowers the voltage swing at the output of the tuned buffer. As a result, in one embodiment, the bypass clock is injected into the circuit "parallel" to the conventional clock or clocks.

Figure 4:
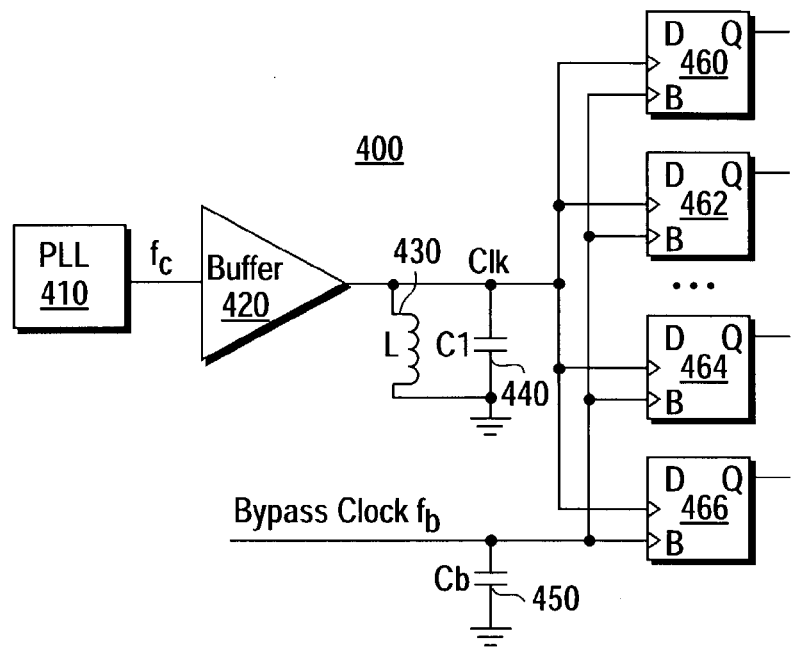
FIG. 4 illustrates one embodiment for implementing a bypass clock mode in a high-speed synchronous circuit.

FIG. 4 illustrates one embodiment for implementing a bypass clock mode in a high-speed synchronous circuit. A clock, $f_c$, is generated from PLL circuit 410 for normal or conventional operation of the circuit. The clock, $f_c$, is input to buffer 420, which in turn, drives an inductive-capacitive ("LC") load, illustrated by inductor 430 and capacitor 440 in FIG. 4. The buffered clock, $f_c$, is input to a plurality of synchronous circuits (e.g., flip-flops 460, 462, 464, and 466). For this embodiment, the bypass clock, $f_b$, is directly input to the synchronous circuits (e.g., flip-flops 460, 462, 464 and 466), parallel to the conventional clock, $f_c$. Although FIG. 4 illustrates parallel inputs to D type flip-flops, the technique may be applied to any synchronous circuit without deviating from the spirit or scope of the invention. For the embodiment of FIG. 4, a capacitor, $C_b$ (450), represents the capacitance of the bypass clock input.

Figure 5:
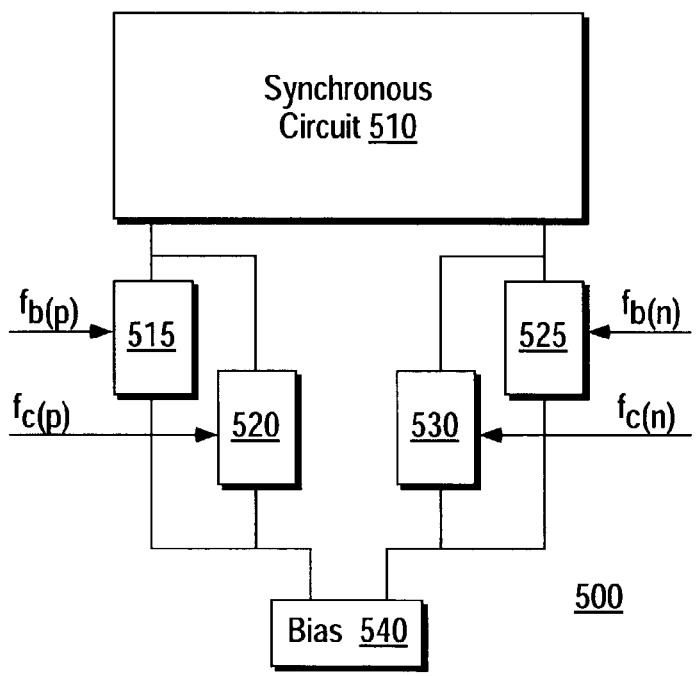
FIG. 5 is a block diagram illustrating one embodiment for a parallel bypass clock circuit.

FIG. 5 is a block diagram illustrating one embodiment for a parallel bypass clock circuit. The parallel bypass clock circuit 500 is implemented with synchronous circuit 510. The synchronous circuit 510 employs a differential configuration, and thus receives differential clocks. The synchronous circuit 510 may be any type of digital logic circuit implemented with any type of logic family. A current-mode logic ("CML") latch is described below in conjunction with a discussion of FIG. 6. As shown in FIG. 5, conventional clocks, fc(p) and fc(n), are input to clock receiving circuits 520 and 530, respectively. Clock receiving circuits 515 and 525 are configured in parallel to clock receiving circuits 520 and 530. Clock receiving circuits 515 and 525 receive differential clocks fb(p) and fb(n). In one embodiment, clock receiving circuits comprise transistors, such that the gate or base of the transistors receives the clock input. As shown in FIG. 5, bypass clock circuit 500 includes a bias circuit 540 to bias the clock receiving circuits 515, 520, 525 and 530.

Figure 6:
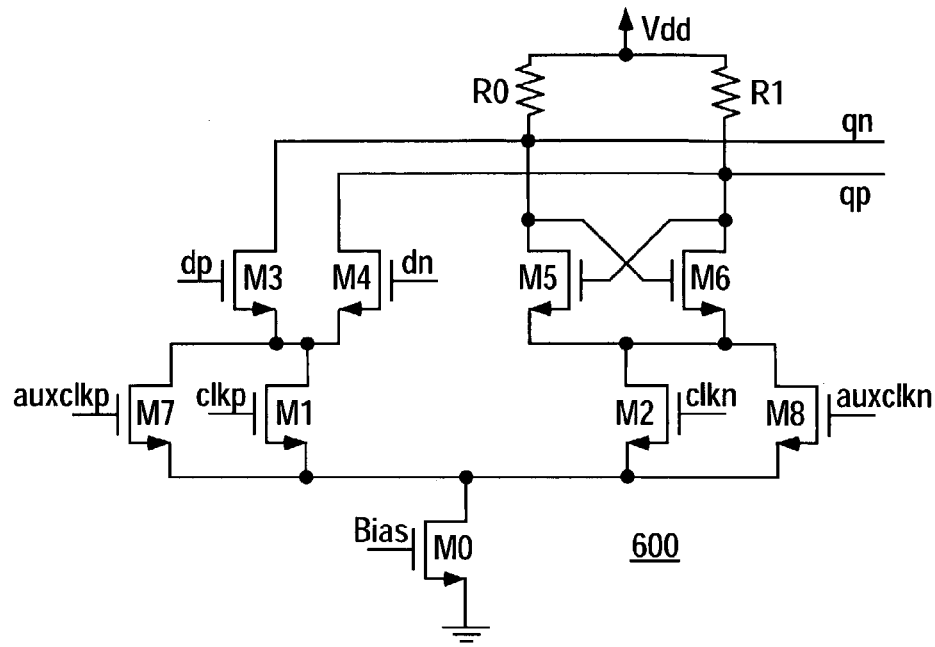
FIG. 6 illustrates one embodiment for a current mode logic latch incorporating the parallel bypass clock techniques of the present invention.

FIG. 6 illustrates one embodiment for a current mode logic latch incorporating the parallel bypass clock techniques of the present invention. As shown in FIG. 6, the latch 600 includes a cross-coupled transistor pair M5 and M6. The sources of the cross-coupled transistor pair (M5 and M6) are coupled to the drains of MOS transistors M2 and M8. One of the conventional differential clocks, $clk_n$, is input to the gate of transistor M2, and one of the bypass differential clocks, $auxclk_n$, is input to the gate of transistor M8. Differential inputs, $d_p$ and $d_n$, are input to the gates of MOS transistors M3 and M4, respectively. The drains of transistors M3 and M4 are coupled to the differential outputs of the latch, $q_n$ and $q_p$. The source of transistors M3 and M4 are coupled to the drains of transistors M7 and M1, respectively. Transistor M1 receives, at its gate, one of the conventional differential clock signals, $clk_p$, and transistor M7 receives, at its gate, one of the bypass differential clock signals, $auxclk_p$. The source of transistor M1 is coupled to the source of transistors M2, M7 and M8, and to the drain of transistor M0. Transistor M0 is biased as a constant current sourcewith appropriate voltage "bias" set at its gate, as shown in FIG. 6.

When differential clock $clk_p$ is in a high logic level, and $clk_n$ clock signal is in a low logic level, the cross-coupled transistor pair, M5 and M6, do not latch the input data ($d_p$ and $d_n$), and thus the differential inputs $d_p$ and $d_n$ are propagated directly to the outputs of the latch, $q_p$ and $q_n$. Alternatively, when clock signal clkn attains a high logic level and clock signal $clk_p$ attains a low logic, the latch (cross coupled transistors M5 and M6) holds the previous values presented on the differential output, $q_p$ and $q_n$.

In general, to add a parallel bypass clock to the CML latch, the auxiliary differential transistors pair, M7 and M8, is added to the basic CML latch. For this embodiment, transistor M7 is coupled in parallel with transistor M1, and transistor M8 is coupled in parallel with transistor M2. Transistor M7 receives, at its gate, a bypass or auxiliary clock ($auxclk_p$), and transistor M8 receives, at its gate, an auxiliary or bypass $clock_n$ ($auxclk_n$). Similar to the transistors M1 and M2, the sources of transistors M7 and M8 are coupled to a bias transistor, M0.

During normal operation, the external bypass clock signals ($auxclk_p$ and $auxclk_n$) are pulled to ground. A low logic level from signals $auxclk_p$ and $auxclk_n$ turn off transistors M7 and M8. With transistors M7 and M8 off, the CML latch operates in normal mode (i.e., the transistor pair M7 and M8 do not affect the operation of the latch). However, when an external bypass clock is injected, clock signals auxclk$_p$ and auxclk$_n$ bias transistors M7 and M8 at the appropriate common mode level to turn on transistors M7 and M8. Also, clock signals clkp and clkn are pulled to ground, thereby turning off transistors M1 and M2. Thus, for this embodiment, an auxiliary or bypass clock is added to the CML latch without affecting the operation of the LC tuned buffer (i.e., the buffer that drives the conventional clock clk$_p$ and clk$_n$).

Figure 7:
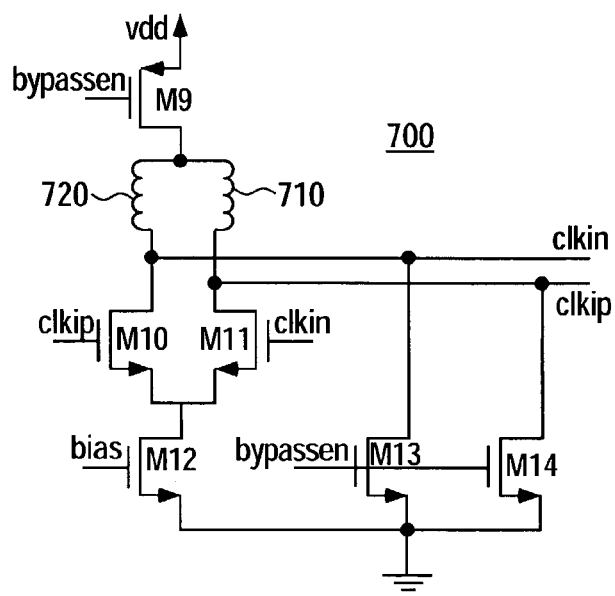
FIG. 7 illustrates one embodiment for a tuned buffer circuit for use with the clock bypass techniques of the present invention.

FIG. 7 illustrates one embodiment for a tuned buffer circuit for use with the clock bypass techniques of the present invention. For this embodiment, the tuned buffer circuit 700 includes transistors M9 M10, M11, M12, M13 and M14. Also, the tuned buffer 700 includes inductors 710 and 720. A bypass enable signal (bypassen) is input to the gate of transistor M9, and input to the gates of transistors M13 and M14. Differential clock signals clkip and clkin (e.g., output from a PLL circuit) are input to transistor pair M10 and M11. The drains of transistors M14 and M11 drive the output clock signal clk$_p$, and the drains of transistors M10 and M13 drive the output clock signal clk$_n$.

In the normal mode of operation, the control signal, bypassen, is a low logic level. This enables buffer circuit 700 by turning on transistor M9 and turning off transistors M13 and M14. To operate in the bypass mode, the control signal, bypassen, is set to a high logic level. In turn, the high logic level of bypassen signal turns off transistor M9 to disable the buffer. In addition, the control signal bypassen turns on transistors M13 and M14 to pull clock signals clk$_p$ and clk$_n$ to ground.

Figure 8:
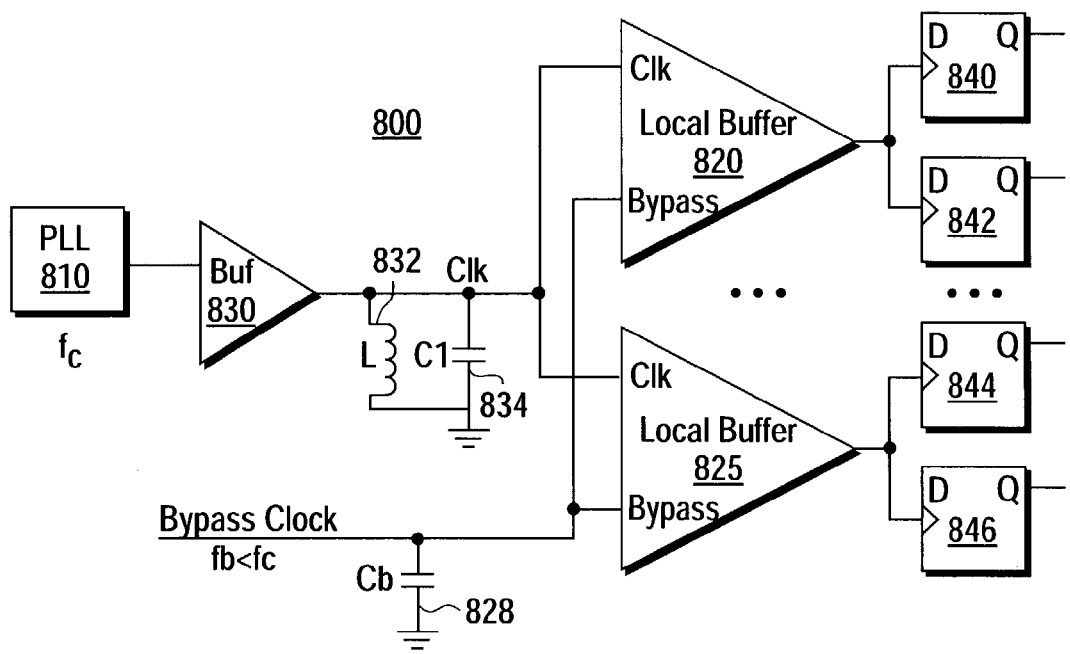
FIG. 8 is a block diagram illustrating another embodiment for the parallel bypass clock techniques of the present invention.

FIG. 8 is a block diagram illustrating another embodiment for the parallel bypass clock techniques of the present invention. Circuit 800 includes a tuned buffer 830 for buffering the clock, f$_c$, during normal mode of operation. The clock, f$_c$, is generated from the phase locked loop ("PLL") circuit 810. The buffer 830 drives an inductive-capacitive ("LC") load, illustrated by inductor 832 and capacitor 834 in FIG. 8. In some implementations of synchronous circuits, additional clock buffering, without LC tuning, is required for proper operation of the circuits. The buffered clock output from tuned buffer 830 is input to one or more local buffers (e.g., buffers 820 and 825 in FIG. 8). The local buffers (820 and 825) are not tuned buffers. For this embodiment, a bypass clock, along with the clock, f$_c$, are input to the local buffers. The local buffers (820 and 825) drive the clock input to one or more synchronous circuits (e.g., circuits 840, 842, 844 and 846). A local buffer may be configured to drive the clock inputs of one or more circuits, as appropriate.

Figure 9:
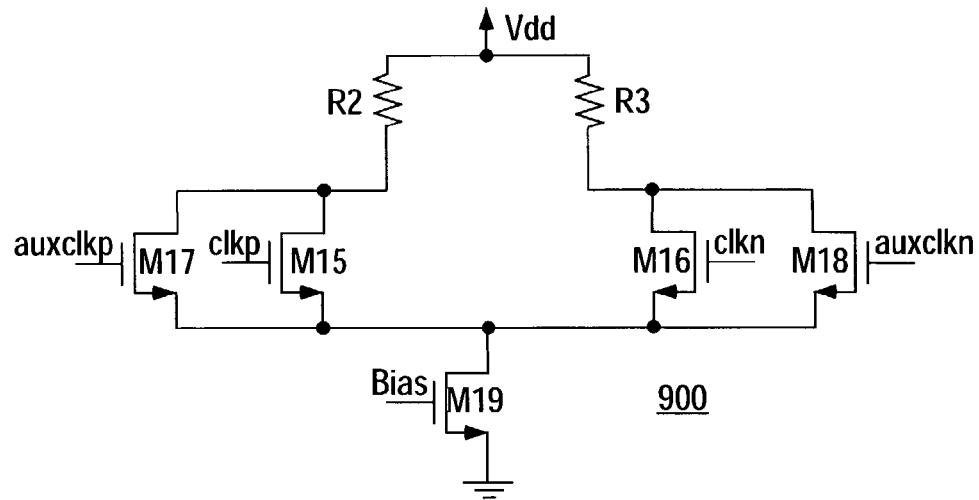
FIG. 9 illustrates one embodiment of a local clock buffer with parallel bypass clock input.

FIG. 9 illustrates one embodiment of a local clock buffer with parallel bypass clock input. For this embodiment, local clock buffer 900 is implemented using MOS transistor (e.g., current-mode logic). The local buffer 900 includes transistors M15 and M16, for normal clock mode operation, transistors M17 and M18, for bypass clock mode operation, and transistor M19 for biasing. Resistors R2 and R3, coupled to a power supply voltage, V$_{dd}$, provide gain in the differential buffer.

Under normal clock operation, differential inputs, clkp and clkn, input to the gates of transistors M15 and M16, respectively, are driven by a clock signal output from a tuned buffer (e.g., tuned buffer 830 of FIG. 8). The bypass clock inputs, auxclkp and auxclkn, are input to the gates of transistors M17 and M18. During normal clock operation, bypass clock inputs, auxclkp and auxclkn, are held to ground. A low logic level on auxclkp and auxclkn lines turn off transistors M17 and M18. Under bypass clock mode operation, the tuned buffer pulls the clock lines, clkp and clkn, to ground. One embodiment to pull clock lines clkp and clkn to ground in a tuned buffer is shown in FIG. 7. Also, under bypass clock mode operation, the differential bypass clocks, auxclkp and auxclkn, are driven for input to the gates of transistor M17 and M18. During both modes of operation, a differential clock output is developed across resistor R2 and R3 on output nodes outn and outp.

Figure 10:
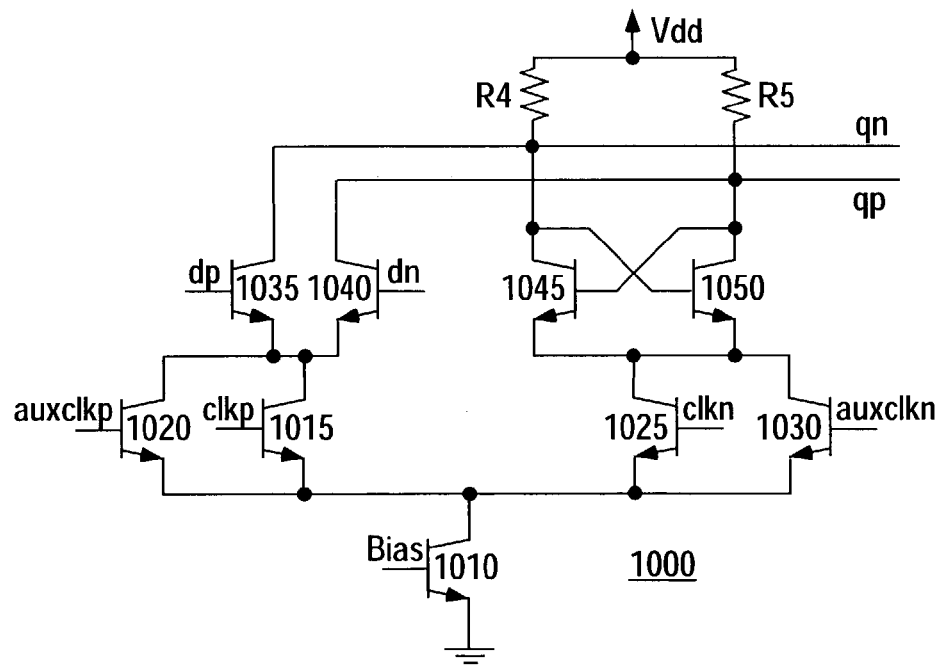
FIG. 10 illustrates one embodiment for an emitter coupled logic ("ECL") latch incorporating the parallel bypass clock techniques of the present invention.

FIG. 10 illustrates one embodiment for an emitter coupled logic ("ECL") latch incorporating the parallel bypass clock techniques of the present invention. As shown in FIG. 10, latch 1000 includes cross-coupled bipolar transistor pair 1045 and 1050. The emitter of the cross-coupled transistor pair (1045 and 1050) is coupled to the collectors of npn transistors 1025 and 1030. One of the conventional differential clocks, clk$_n$, is input to the base of transistor 1025, and one of the bypass differential clocks, auxclk$_n$, is input to the base of transistor 1030. Differential inputs, d$_p$ and d$_n$, are input to the bases of npn transistors 1035 and 1040, respectively. The collectors of transistors 1035 and 1040 are coupled to the differential outputs of the latch, q$_n$ and q$_p$. The emitters of transistors 1035 and 1040 are coupled to the collectors of transistors 1020 and 1015, respectively. Transistor 1015 receives, at its base, one of the conventional differential clock signals, clk$_p$, and transistor 1020 receives, at its base, one of the bypass differential clock signals, auxclk$_p$. Transistor 1010 is biased with a constant current source, "bias", as shown in FIG. 10.

When clock signal clk$_p$ is in a high logic level, and clock signal clk$_n$ is in a low logic level, the cross coupled transistor pair, 1045 and 1050, do not latch the input data (d$_p$ and d$_n$), and thus the differential inputs d$_p$ and d$_n$ are propagated directly to the outputs of the latch, q$_p$ and q$_n$. Alternatively, when clock signal clk$_n$ attains a high logic level and clock signal clk$_p$ attains a low logic, the latch (cross coupled transistors 1045 and 1050) holds the previous values presented on the differential output, q$_p$ and q$_n$.

To add a parallel bypass clock to the ECL latch, the auxiliary differential transistor pair, 1020 and 1030, is added to the basic ECL latch as shown in FIG. 10. Specifically, transistor 1020 receives, at its base, auxiliary clock$_p$ (auxclk$_p$), and transistor 1030 receives, at its base, auxiliary clock$_n$ (auxclk$_n$). During normal operation mode, the external bypass clock signals (auxclk$_p$ and auxclk$_n$) are pulled to ground. A low logic level from signals auxclk$_p$ and auxclk$_n$ turn off transistors 1020 and 1030. With transistors 1020 and 1030 off, the ECL latch operates in normal mode. However, when an external bypass clock is injected, clock signals auxclk$_p$ and auxclk$_n$ bias transistors 1025 and 1030 at the appropriate level to turn on transistors 1020 and 1030. Also, clock signals clkp and clkn are pulled to ground, thereby turning off transistors 1015 and 1025. Thus, for this embodiment, an auxiliary or bypass clock is added to the ECL latch without affecting the operation of the LC tuned buffer (i.e., the buffer that drives the conventional clock clk$_p$ and clk$_n$).

Although the present invention has been described in terms of specific exemplary embodiments, it will be appreciated that various modifications and alterations might be made by those skilled in the art without departing from the spirit and scope of the invention.

What is claimed is:

1. A circuit comprising:
    inductive-capacitive ("LC") buffer for receiving a clock signal and for generating a first clock signal; and
    at least one synchronous circuit comprising first and second clock inputs, said first clock input for receiving said first clock signal, said first clock signal for providing timing for said synchronous circuit under a normal mode of operation, and said second clock input for receiving a second clock signal, said second clock signal for providing timing for said synchronous circuit under a test mode of operation, said second clock signal comprising a frequency lower than said first clock signal.

2. The circuit as set forth in claim 1, wherein said LC buffer comprises a control circuit for buffering said first clock signal under said normal mode of operation and for disabling said first clock signal under said test mode of operation.

3. The circuit as set forth in claim 1, wherein said synchronous circuit comprises:
first clock receiver circuit, coupled to said first clock input, for providing said first clock signal under said normal mode of operation; and
second clock receiver circuit, coupled parallel to said first clock receiver circuit and coupled to said second clock input, for providing said second clock signal under said test mode of operation.

4. The circuit as set forth in claim 3, wherein said first and second clock receiver circuits comprise transistors.

5. The circuit as set forth in claim 1, wherein said synchronous circuit comprises:
third clock input for receiving a third clock signal complementary to said first clock signal, and for providing timing to said synchronous circuit under said normal mode of operation; and
fourth clock input for receiving a fourth clock signal, complementary to said second clock signal, and for providing timing to said synchronous circuit under said test mode of operation.

6. The circuit as set forth in claim 1, wherein said circuit comprises a circuit utilizing current mode logic ("CML").

7. The circuit as set forth in claim 1, wherein said circuit comprises a circuit utilizing emitter coupled logic ("ECL").

8. The circuit as set forth in claim 1, wherein said synchronous circuit comprises a latch.

9. The circuit as set forth in claim 1, wherein said synchronous circuit comprises a flip-flop.

10. A circuit comprising:
synchronous circuit comprising at least one input clock line for receiving a clock signal for said circuit;
first clock receiver circuit for receiving a first clock signal and for providing timing to said circuit under normal mode of operation; and
second clock receiver circuit, coupled to said clock signal line and coupled parallel to said first clock receiver circuit, for receiving a second clock signal and for providing timing to said circuit under a test mode of operation, said second clock signal comprising a frequency lower than said first clock signal.

11. The circuit as set forth in claim 10, further comprising control circuit, coupled to said first and second clock receiver circuits, for buffering said first clock signal under said normal mode of operation and for disabling said first clock signal under said test mode of operation.

12. The circuit as set forth in claim 10, further comprising:
a second clock signal line coupled to said synchronous circuit;
third clock receiver circuit, coupled to said second clock signal line, for receiving a third clock signal complementary to said first clock signal, and for providing timing to said circuit under said normal mode of operation; and
fourth clock receiver circuit, coupled to said second clock signal line and coupled parallel to said third clock receiver circuit, for receiving a fourth clock signal, complementary to said second clock signal, and for providing timing to said circuit under said test mode of operation.

13. The circuit as set forth in claim 10, wherein said synchronous circuit comprises a circuit utilizing current mode logic ("CML").

14. The circuit as set forth in claim 10, wherein said synchronous circuit comprises a circuit utilizing emitter coupled logic ("ECL").

15. The circuit as set forth in claim 10, wherein said synchronous circuit comprises a latch.

16. The circuit as set forth in claim 10, wherein said synchronous circuit comprises a flip-flop.

17. The circuit as set forth in claim 10, further comprising an inductive-capacitive ("LC") buffer that includes said control circuit.

18. The circuit as set forth in claim 10, wherein said first and second clock receiver circuits comprise transistors.

19. A method for providing a test clock for a circuit, said method comprising the steps of:
receiving a clock signal at an inductive-capacitive ("LC") buffer;
generating a first clock signal at said LC buffer;
receiving said first clock signal at a first input of a synchronous circuit;
receiving said first clock signal at a first input of a synchronous circuit;
providing timing for said synchronous circuit under a normal mode of operation with said first clock signal;
receiving a second clock signal at a second input of a synchronous circuit, said second input being parallel to said first input; and
providing timing for said synchronous circuit under a test mode of operation with said second clock signal.

20. The method as set forth in claim 19, further comprising the steps of:
buffering said first clock signal under said normal mode of operation; and
disabling said first clock signal under said test mode of operation.

21. The method as set forth in claim 19, wherein:
the step of providing timing for said synchronous circuit under a normal mode of operation with said first clock signal comprises the step of coupling a first clock receiver circuit to said first clock input; and
the step of providing timing for said synchronous circuit under a test mode of operation with said second clock signal comprises the step of coupling a second clock receiver circuit to said second clock input.

22. The method as set forth in claim 21, wherein said first and second clock receiver circuits comprise transistors.

23. The method as set forth in claim 19, further comprising the steps of:
receiving a third clock signal complementary to said first clock signal;
providing timing to said synchronous circuit under said normal mode of operation using said first and third clock signals;
receiving a fourth clock signal complementary to said second clock signal; and
providing timing to said synchronous circuit under said test mode of operation using said first and third clock signals.

24. The method as set forth in claim 19, wherein said circuit comprises a circuit utilizing current mode logic ("CML").

25. The method as set forth in claim 19, wherein said synchronous circuit comprises a latch.

26. The method as set forth in claim 19, wherein said synchronous circuit comprises a flip-flop.

27. A circuit comprising:
   inductive-capacitive ("LC") buffer for receiving a first clock signal and for buffering said first clock signal;
   buffer, coupled to said LC buffer, for receiving said first clock signal and a second clock signal, and for buffering, during a normal mode of operation, said first clock signal or for buffering said second clock signal during a bypass clock mode of operation; and
   synchronous circuit comprising an input clock line coupled to said buffer for receiving on said input clock line said first clock signal during said normal mode of operation and said second clock signal during said bypass clock of operation.

28. The circuit as set forth in claim 27, wherein said buffer for receiving said first clock signal and said second clock signal in parallel.

29. The circuit as set forth in claim 27, further comprising a control circuit for enabling said first clock signal under said normal mode of operation and for disabling said first clock signal under said auxiliary mode of operation.

\* \* \* \* \*